(12) United States Patent
Son et al.

(10) Patent No.: US 9,371,235 B2
(45) Date of Patent: Jun. 21, 2016

(54) METHOD FOR PREPARING GRAPHENE

(71) Applicant: Samsung Electronics Co., Ltd., Suwon-Si, Gyeonggi-Do (KR)

(72) Inventors: In Hyuk Son, Yongin-si (KR); Seung Jae Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/202,728

(22) Filed: Mar. 10, 2014

(65) Prior Publication Data
US 2014/0255500 A1 Sep. 11, 2014

(30) Foreign Application Priority Data

Mar. 11, 2013 (KR) ........................ 10-2013-0025846

(51) Int. Cl.
*A61K 9/00* (2006.01)
*C01B 31/04* (2006.01)
*H01L 21/02* (2006.01)
*B82Y 30/00* (2011.01)
*B82Y 40/00* (2011.01)
*B01J 23/755* (2006.01)
*B01J 21/04* (2006.01)

(52) U.S. Cl.
CPC ........... *C01B 31/0453* (2013.01); *B01J 23/755* (2013.01); *B82Y 30/00* (2013.01); *B82Y 40/00* (2013.01); *H01L 21/02527* (2013.01); *B01J 21/04* (2013.01); *Y10T 428/2982* (2015.01)

(58) Field of Classification Search
CPC .................................................. C01B 31/0453
See application file for complete search history.

(56) References Cited

U.S. PATENT DOCUMENTS

| 3,378,345 A * | 4/1968 | Bourdeau | B82Y 30/00 423/447.3 |
|---|---|---|---|
| 2009/0068470 A1 | 3/2009 | Choi et al. | |
| 2009/0155161 A1 | 6/2009 | Yoon et al. | |
| 2011/0206934 A1 | 8/2011 | Bol et al. | |
| 2012/0088123 A1 | 4/2012 | Choi et al. | |
| 2012/0237432 A1 | 9/2012 | Son et al. | |
| 2013/0187097 A1 | 7/2013 | Hong et al. | |
| 2013/0243969 A1* | 9/2013 | Teng | B82Y 40/00 427/539 |
| 2014/0031200 A1 | 1/2014 | Son et al. | |

FOREIGN PATENT DOCUMENTS

| EP | 2689849 A1 | 1/2014 |
|---|---|---|
| KR | 20110006644 A | 1/2011 |
| KR | 20110064072 A | 6/2011 |
| KR | 20120007998 A | 1/2012 |
| KR | 101121164 B1 | 3/2012 |
| KR | 101138141 B1 | 4/2012 |
| KR | 20120104722 A | 9/2012 |
| WO | WO-2009/035214 A1 | 3/2009 |

OTHER PUBLICATIONS

S. Wang et al.: "Synthesis, growth mechanism and thermal stability of copper nanoparticles encapsulated by multi-layer graphene"; Carbon, vol. 50, issue 6, pp. 2119-2125; May 2012.
Q. Liu et al.: "Preparation of graphene-encapsulated magnetic microspheres for protein/peptide enrichment and MALDI-TOF MS analysis"; Chemical Communications, vol. 48, pp. 1874-1876; 2012.
B. Machado et al.: "Graphene-based materials for catalysis"; Catalysis Science & Technology, vol. 2, pp. 54-75; 2012.
Dongyun Chen, "Graphene-Encapsulated Hollow FE304 Nanoparticle Aggregates as a High-Performance Anode Material for Lithium Ion Batteries", American Chemical Society, Jul. 12, 2011, pp. 3078-3083.
Hailiang Wang, "NI(OH)2 Nanoplates Grown on Graphene As Advanced Electrochemical Pseudocapacitor Materials", American Chemical Society, 2010, pp. 7472-7477.
Shubin Yang, "Fabrication of Graphene-Encapsulated Oxide Nanoparticles: Towards High-Performance Anode Materials for Lithium Storage", Angew. Chem. Int. Ed. 2010, pp. 8408-8411.
Weiwei Cai, "Large Area Few-Layer Graphene/Graphite Films as Transparent Thin Conducting Electrodes", American Istitute of Physics, 2009, pp. 123115-1-123115-3.
European Search Report for corresponding European Application No. 14 158 629.7 dated Jun. 25, 2014.

* cited by examiner

*Primary Examiner* — Paul Dickinson
(74) *Attorney, Agent, or Firm* — Harness, Dickey & Pierce, P.L.C.

(57) ABSTRACT

A method of preparing graphene includes supplying a gas on a metal catalyst, the gas including $CO_2$, $CH_4$, and $H_2O$, and reacting and cooling the resultant.

14 Claims, 17 Drawing Sheets

(a)

(b)

(a)

(b)

(a)            (b)

METHOD FOR PREPARING GRAPHENE

CROSS-REFERENCE TO RELATED APPLICATION

This application claims priority to and the benefit of Korean Patent Application No. 10-2013-0025846 filed in the Korean Intellectual Property Office on Mar. 11, 2013, the entire contents of which are incorporated herein by reference.

BACKGROUND

1. Field

Example embodiments provide a method of preparing graphene and a graphene particle manufactured in accordance with this method.

2. Description of the Related Art

Graphene is a conductive material having a two-dimensional honeycomb arrangement of carbon atoms and a thickness of one atom layer.

The graphene forms graphite when three-dimensionally piled, carbon nanotubes when one-dimensionally rolled, and fullerene when zero-dimensionally shaped into a ball, and thus has been regarded as an important model for researching various low-dimensional nano-phenomena.

The graphene is predicted to not only be structurally and chemically very stable but also so conductive that it can transfer electrons 100 times as fast as silicon and flow a current about 100 times as fast as copper.

These predicted characteristics of the graphene have been experimentally proved, since a method of separating graphene from graphite was discovered in 2004, which thrilled scientists all over the world for several years.

The graphene is formed of a relatively light element, carbon, and is easily processed into a one- or two-dimensional nanopattern, which may not only be used to adjust semiconductor-conductor properties, but also be vastly applied to functional devices (e.g., sensors and/or memories) by using various chemical bonds of the carbon.

Accordingly, a technology using the graphene draws a lot of attention, but a method of massively producing the graphene with a relatively low cost, a large area, and reproducibility has not yet been developed.

In general, the graphene may be prepared in five methods. A first method is mechanical or chemical peeling or breaking large graphite into pieces and thus forming a monolayer, but it is difficult to prepare graphene having a large area.

A second method is epitaxy synthesis of raising carbon adsorbed or included in a crystal at a relatively high temperature into graphene on the surface thereof to form graphene having a large area, but has a drawback of needing an expensive substrate device and bringing about relatively insufficient electrical characteristics.

In addition, an organic synthesis method may use tetraphenyl benzene, but has drawbacks of being difficult to produce graphene having a large area and it is expensive.

Lastly, a chemical vapor deposition method synthesizes graphene by depositing a transition metal (Ni or Cu) catalyst layer on a substrate that adsorbs carbon well, reacting the substrate having the catalyst layer with a mixed gas of $CH_4$ and hydrogen at a relatively high temperature (1000° C.) so that carbon in an appropriate amount is melted or adsorbed in the catalyst layer, and then cooling the carbon melted or adsorbed in the catalyst layer on the substrate by using a melting temperature difference between the catalyst and the carbon.

However, this method has a drawback of separating the catalyst layer and the graphene layer with a relatively high cost at a relatively high reaction temperature.

In addition, the method has difficulties in regulating reaction time of methane and hydrogen gas, a cooling rate, concentration of a reaction gas, and/or thickness of a catalyst layer, and continuously performing a process.

SUMMARY

Example embodiments provide a method of preparing graphene with relatively high efficiency at a relatively low reaction temperature.

Example embodiments provide a nanoparticle including the graphene prepared according to the method of example embodiments.

Example embodiments provide a patterned graphene or graphene sheet prepared according to the method of example embodiments.

According to example embodiments, a method of preparing graphene includes supplying a gas to a metal catalyst, the gas including $CO_2$, $CH_4$, and $H_2O$, reacting while heating, and cooling the resultant.

The metal catalyst may include at least one metal selected from Ni, Co, Cu, Fe, Rh, Ru, Pt, Au, Al, Cr, Mg, Mn, Mo, Si, Sn Ta, Ti, W, U, V, Zr, brass, bronze, stainless steel, and Ge, or an alloy including two or more of the aforementioned metals.

The $CH_4$:$CO_2$:$H_2O$ gases may be mixed in a mole ratio of about 1:0.20-0.50:0.01-1.45. The $CH_4$:$CO_2$:$H_2O$ gases may be mixed in a mole ratio of about 1:0.25-0.45:0.10-1.35. The $CH_4$:$CO_2$:$H_2O$ gases may be mixed in a mole ratio of about 1:0.30-0.40:0.50-1.0.

The reacting may heat the resultant at about 400 to about 900° C. The cooling may cool the resultant at a given rate in the presence of an inert gas. The metal catalyst may be supported by a porous carrier of one of $Al_2O_3$, $SiO_2$, zeolite, $TiO_2$, and silicon.

The metal catalyst may be supported by the porous carrier while being bonded thereto to form a metal catalyst-porous carrier composite. The metal catalyst may be in a form of a nanoparticle.

Alternatively, the metal catalyst may be in a form of one of a film and a substrate, and a carrier supporting the metal catalyst may be on at least one part of the metal catalyst in the form of one of the film and the substrate. The metal catalyst may be in the form of one of a Ni film and the substrate. The carrier on at least one part of the metal catalyst may be in an ionic form of one of Al, Si and Ti. The carrier on at least one part of the metal catalyst may be provided in a patterned form.

According to example embodiments, a method of manufacturing a semiconductor circuit may include the method of example embodiments, wherein the carrier may be provided in a patterned form on at least one part of the metal catalyst in a form of one of the film and the substrate.

According to example embodiments, a graphene-encapsulated metal nanoparticle may be prepared in accordance with the method of example embodiments.

The metal nanoparticle may include at least one metal selected from Ni, Co, Cu, Fe, Rh, Ru, Pt, Au, Al, Cr, Mg, Mn, Mo, Si, Sn, Ta, Ti, W, U, V, Zr, brass, bronze, stainless steel, and Ge, or an alloy including two or more the foregoing metals. The metal nanoparticle may have a diameter of about 1 to about 50 nm. The graphene-encapsulated metal nanoparticle may be used in one of a light emitting material for a display, an electrode material of a battery or a solar cell, and an in vivo drug delivery material.

According to example embodiments, a hollow graphene nanoparticle prepared by removing the metal nanoparticle from the graphene-encapsulated metal nanoparticle may be prepared according to the method of example embodiments.

The graphene may be made up of one sheet to five sheets.

The Ni film may be removed from the patterned graphene on the Ni film, obtaining the patterned graphene.

Figure 7:
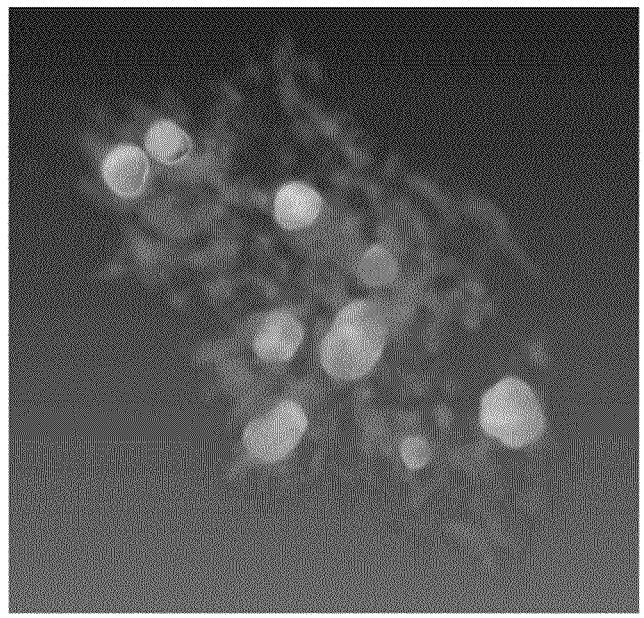

FIG. 7 is a 3D TEM image showing a metal catalyst for graphene growth supported on a porous carrier according to Preparation Example 1.

Figure 8:
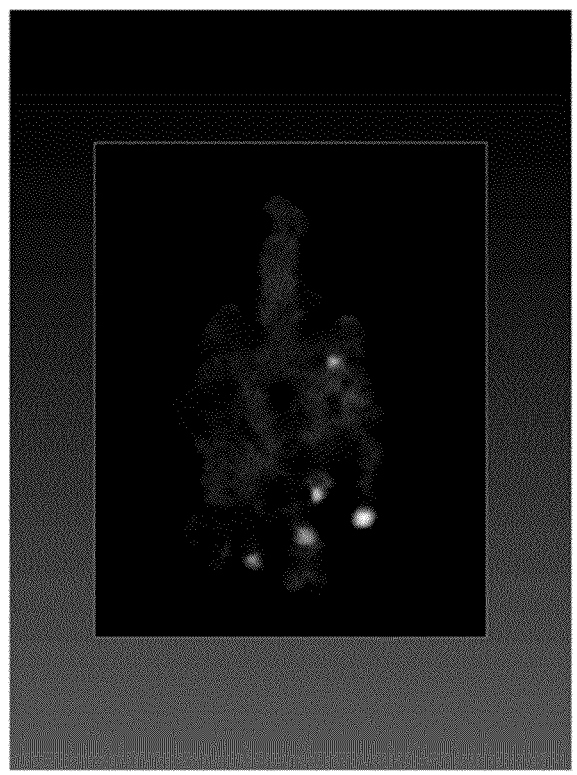

FIG. 8 is a 3D TEM image showing a metal catalyst for graphene growth supported on a porous carrier according to Preparation Example 2.

Figure 9:
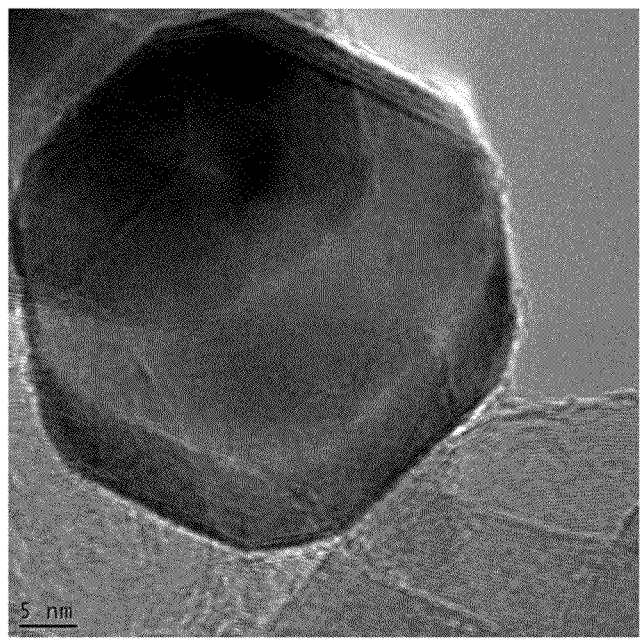

FIG. 9 is a TEM photograph showing the metal catalyst for graphene growth according to Preparation Example 1 after a reaction of forming graphene on the catalyst.

Figure 10:
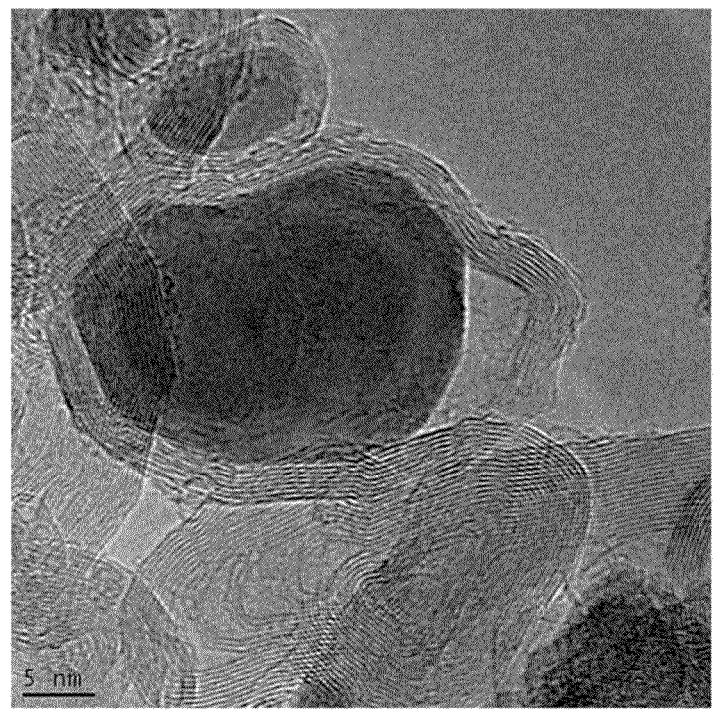

FIG. 10 is a TEM photograph showing the catalyst for graphene growth according to Preparation Example 2 after a reaction forming graphene on the catalyst.

Figure 11:
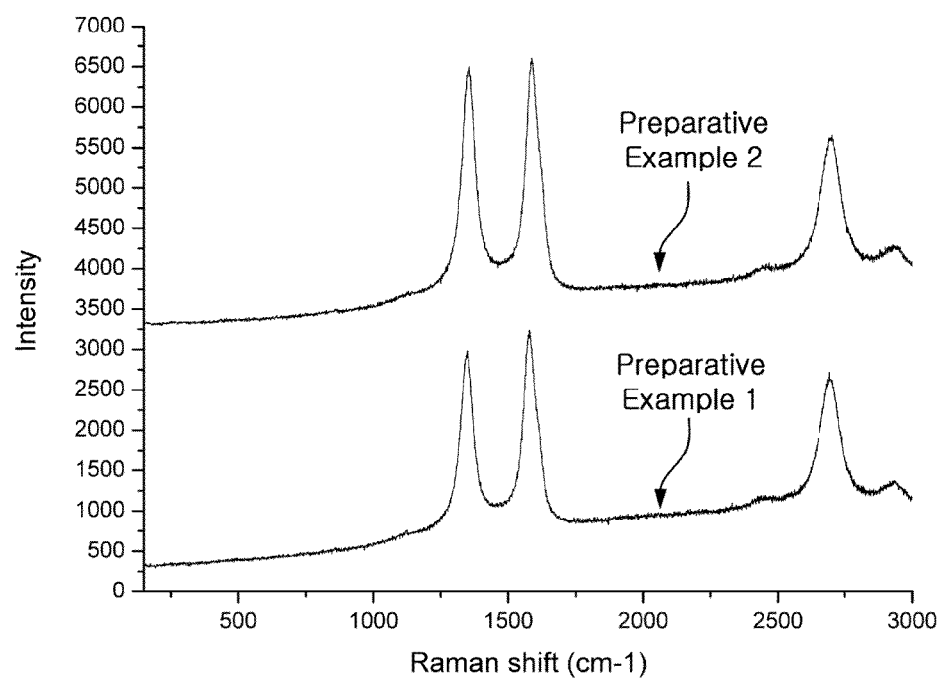

FIG. 11 is a Raman graph showing that graphene is formed after the reactions of forming graphene on a catalyst for graphene growth according to Preparation Examples 1 and 2.

Figure 12:
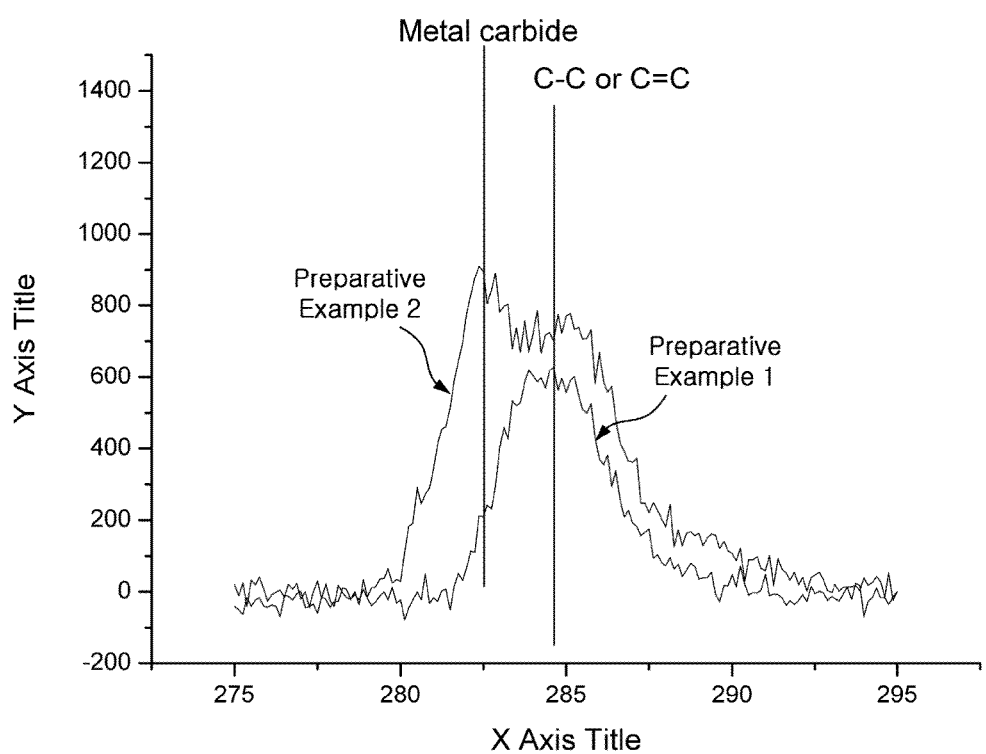

FIG. 12 is an XPS graph showing that graphene is formed after the reactions of forming graphene on a catalyst for graphene growth according to Preparation Examples 1 and 2.

Figure 13:
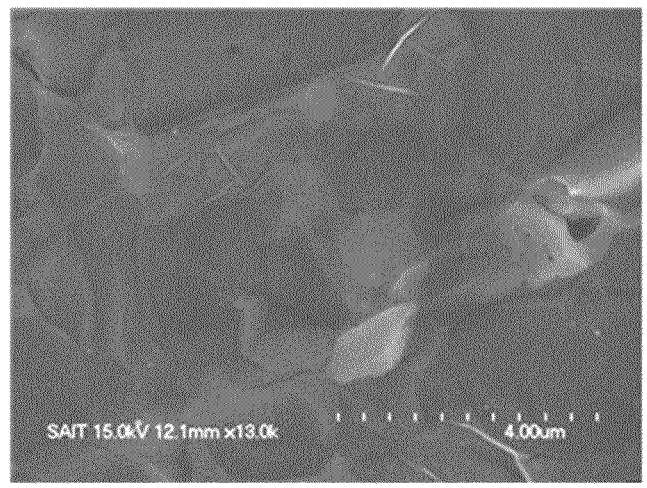

FIG. 13 is a SEM photograph showing that graphene is formed on an Al ion-coated catalyst on a Ni film according to Preparation Example 3.

Figure 14:
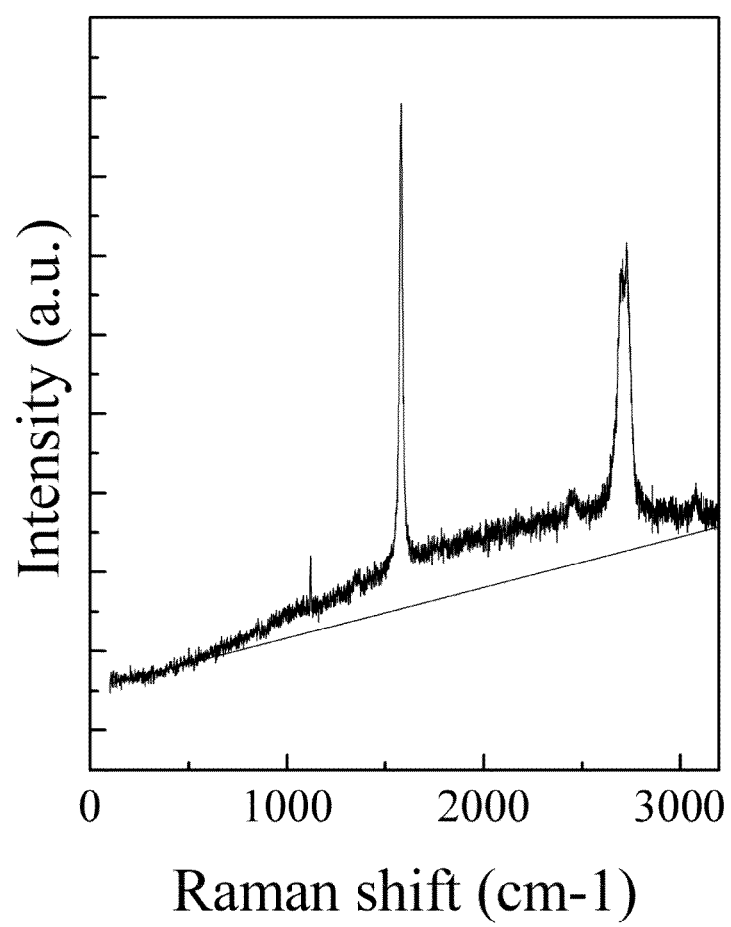

FIG. 14 is a Raman graph showing that graphene is formed on a part where Al ions are coated out of the Al ion-coated catalyst on a Ni film according to Preparation Example 3.

Figure 15:
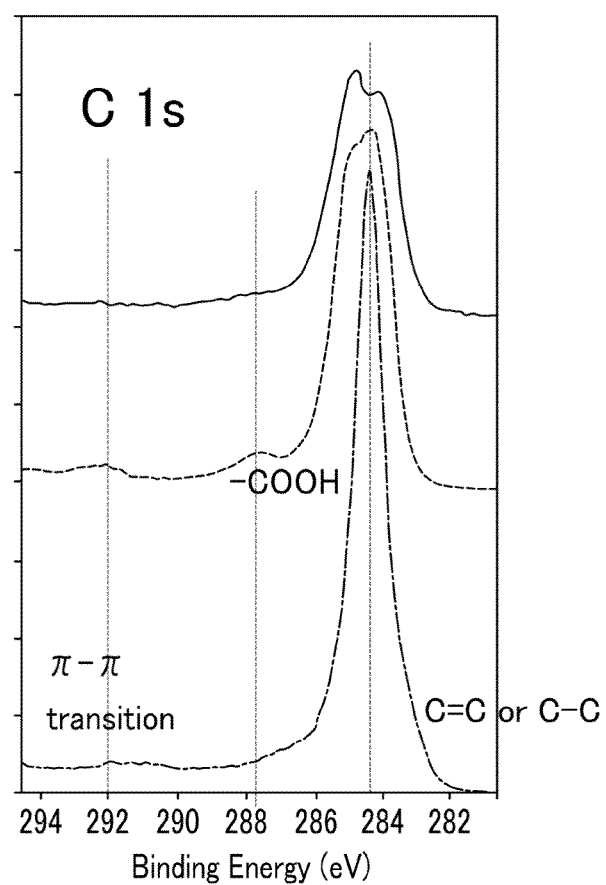

FIG. 15 is an XPS graph showing that graphene is formed on a part where Al ions are coated out of the Al ion-coated catalyst on a Ni film according to Preparation Example 3.

Figure 16:
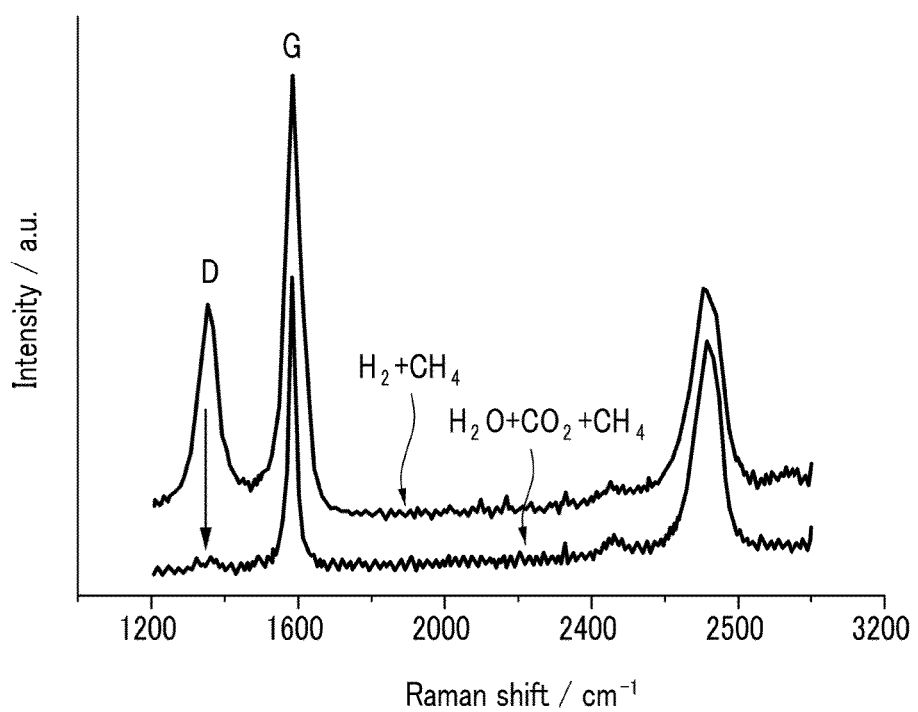

FIG. 16 is a Raman graph showing that graphene is formed on a Ni catalyst deposited on a semiconductor wafer according to Preparation Example 4.

Figure 17:
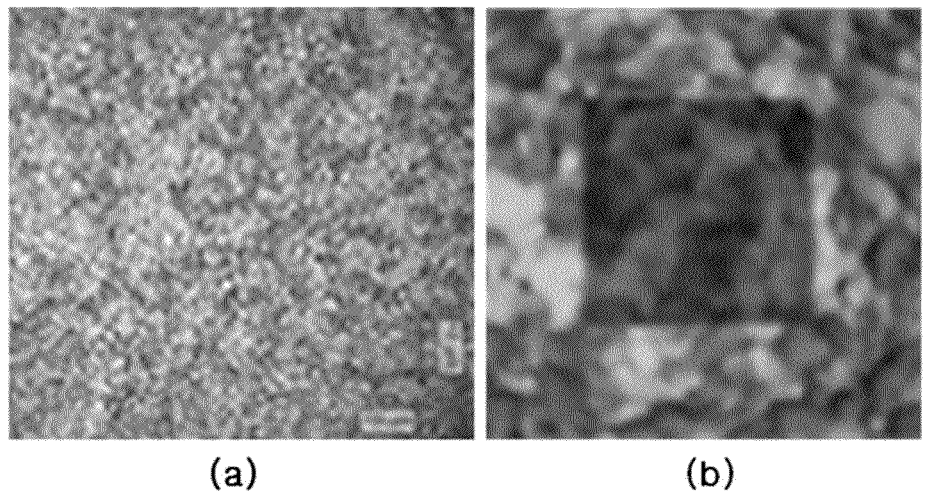

FIG. 17 (a) is a SEM photograph showing that the graphene is formed on a Ni catalyst deposited on a semiconductor wafer according to Preparation Example 4, and FIG. 17 (b) is an enlargement of FIG. 17 (a).

DETAILED DESCRIPTION

The inventive concepts will now be described more fully with reference to the accompanying drawings, in which example embodiments are shown. In the drawings, the same reference numerals denote the same elements, and sizes or thicknesses of elements may be exaggerated for clarity.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing exemplary embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Example embodiments provide a method of preparing graphene that includes supplying a gas including $CO_2$, $CH_4$, and $H_2O$ to a metal catalyst for graphene growth and reacting them by heating, and cooling the resultant.

The metal catalyst may be a transition metal catalyst having relatively high adsorbability for carbon, specifically, at least one metal selected from Ni, Co, Fe, Pt, Au, Al, Cr, Cu, Mg, Mn, Mo, Rh, Si, Sn, Ta, Ti, W, U, V, Zr, brass, bronze, stainless steel, and Ge, or an alloy catalyst, more specifically an alloy catalyst including Ni, Co, Cu, Fe, or two or more of the aforementioned metals, and still more specifically, the metal catalyst may be a Ni catalyst.

The $CH_4$:$CO_2$:$H_2O$ gases may be used in a mole ratio of about 1:0.20-0.50:0.01-1.45, specifically, about 1:0.25-0.45:0.10-1.35, and more specifically, about 1:0.30-0.40:0.50-1.0.

As shown in the reaction ratio, water is required to be included in an amount of at least greater than or equal to about 0.01, but when the water is included in an amount of greater than or equal to about 1.45, carbon is not accumulated on the catalyst but is all converted into $CO_2$, and in addition, the Ni catalyst is completely oxidized, lowering reactivity and thus making it difficult to form graphene.

The heating may be performed at about 400 to about 900° C., specifically, about 500 to about 850° C., and more specifically, about 600 to about 800° C.

The cooling may be performed at a given rate in the presence of an inert gas, for example, nitrogen ($N_2$), argon (Ar), or helium (He) gas.

In example embodiments, the metal catalyst may be supported on a carrier, for example, a porous carrier or silicon.

The porous carrier may be an oxide carrier, e.g., $Al_2O_3$, $SiO_2$, zeolite, or $TiO_2$, for example, $Al_2O_3$.

The silicon may be amorphous silicon, and specifically, a semiconductor wafer.

The metal catalyst may be supported on the carrier in a form that the metal catalyst is adsorbed as spherical nanoparticles on the porous carrier or bonded as ovals, or as asymmetric hexagonal prismatic nanoparticles on the porous carrier in a form of an alloy.

Otherwise, the metal catalyst may be supported on a semiconductor wafer by depositing a metal using a CVD (chemical vapor deposition) method.

As described below in detail, the "composite" of the catalyst metal particles with the porous carrier indicates that each catalyst particle is adhered to an carrier and forms a strong bond therewith through strong interaction between catalyst particles and the carrier and has a circular or oval cross-section when the alloy is vertically cut, as shown in the exaggerated view of FIG. 2 (b).

On the other hand, a method of supporting a metal catalyst on a porous carrier is well-known in a related art.

For example, the method of supporting a metal catalyst on a porous carrier may include depositing at least one metal or an alloy selected from Ni, Co, Fe, Pt, Au, Al, Cr, Cu, Mg, Mn, Mo, Rh, Si, Sn, Ta, Ti, W, U, V, Zr, brass, bronze, stainless steel, and Ge as a catalyst for graphene growth on a carrier, specifically, a porous carrier by using a thermal evaporator, an e-beam evaporator, a sputterer, or through electro-plating, or physically adsorbing the metal catalyst particles for graphene growth on the carrier in a wet method.

For example, the deposition of the metal catalyst particles on a porous carrier using a wet method includes impregnating a porous carrier in an aqueous solution in which a metal catalyst is dissolved, heating the carrier-coated catalyst in an oven, and drying it, and then firing the resultant at a relatively high temperature, reducing the fired catalyst under an inert gas atmosphere while heating at a predetermined or given rate, and then maintaining the reduced catalyst at a relatively high temperature under a hydrogen atmosphere to prepare a catalyst.

Figure 1:
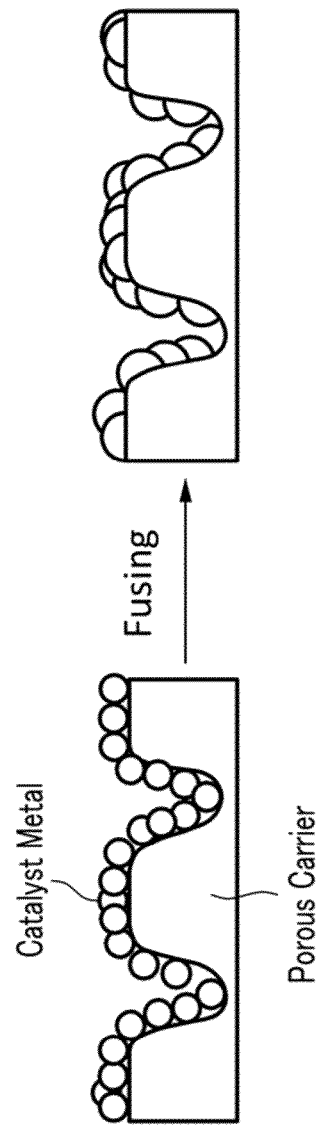
FIG. 1 is a schematic view showing a supported form of a catalyst for graphene growth on a carrier, and the left of which is a cross-sectional view showing catalyst metal particles physically adsorbed on the carrier, while the right thereof is a cross-sectional view showing the carrier and a catalyst metal bonded in a form of an alloy.

FIG. 1 (left) shows that the spherical metal catalyst particles are physically adsorbed on the porous carrier in the prepared catalyst.

On the other hand, the metal catalyst particles may be strongly bonded with the carrier in a form of an alloy as shown in FIG. 1 (right), rather than physically adsorbed on the porous carrier, while still maintaining a spherical shape.

In other words, as shown in FIG. 1 (right), when the metal catalyst particles are more strongly bonded with the porous carrier in a form of an alloy than physically and chemically bonded therewith, the metal catalyst particles have a hemispherical, oval, or upside down boat shape rather than the spherical shape, and thus more widely contact the surface of the porous carrier and have a stronger bond.

FIGS. 2(a)-2(b) are exaggerated enlarged views of each catalyst particle to show a bonding form of the metal catalyst with the porous carrier.

Figure 2:
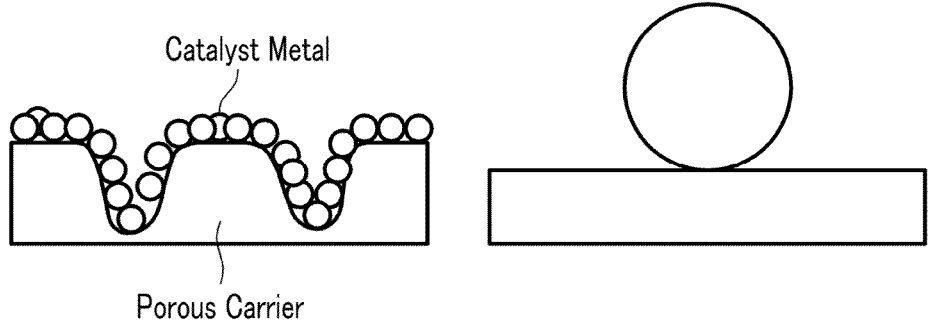
FIGS. 2(a)-(b) are exaggerated enlarged views of each catalyst metal particle in a catalyst supported by physically adsorbing a catalyst metal on a porous carrier (FIG. 2(a)) and another catalyst supported by alloying a catalyst metal and a carrier (FIG. 2(b)).
Figure 2:
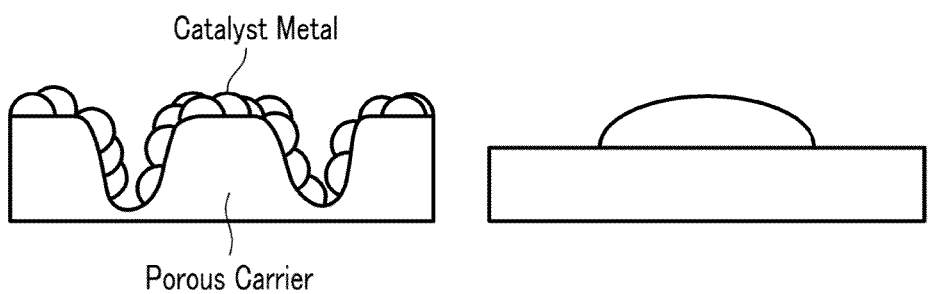

As shown in FIG. 2 (a), when the catalyst metal particles are physically adsorbed on the porous carrier, the catalyst metal particles have a spherical shape and a relatively smaller contact area with the porous carrier.

On the other hand, as shown in FIG. 2 (b), when the catalyst metal particles are bonded with the porous carrier in a form of an composite, each catalyst metal particle has a semi-oval or upside down boat shape and a relatively much larger contact area with the porous carrier compared with the contact area shown in FIG. 2 (a).

As shown in the FIG. 2 (b), the method of fusing the catalyst metal particles with the porous carrier in a form of an metal particle-carrier composite may include a process of cooling down a reactor having the catalyst to room temperature and adding a small amount of water thereto before heating under a hydrogen atmosphere as the last step for preparing the catalyst.

In other words, when the catalyst is adsorbed on the porous carrier according to the aforementioned wet method, and water in a small amount is added to the catalyst metal particles, the catalyst metal particles are pushed and crushed down by the water and thus have an oval shape and are more strongly bonded on the surface of the porous carrier.

In this way, when the catalyst metal particles are bonded with the porous carrier in a form of an composite, the catalyst particles have a larger contact area with the carrier and become more stable at a relatively high temperature. In addition, as described below in detail, carbon atoms are more easily adsorbed into a larger contact interface between the catalyst and carrier, and accordingly, extra carbon atoms are not be accumulated on the surface of the catalyst but react with water and produce CO and $H_2$ gas and thus prevent or reduce deterioration of the catalyst by coking of the catalyst.

Furthermore, as the carrier/catalyst has a larger interface area, a $CO_2$ modifying reaction has higher efficiency on the interface.

Figure 5:
FIG. 5 is a schematic view showing a state in which the extra carbon atoms are not accumulated on the surface of a catalyst but are absorbed into a catalyst layer and thus form a catalyst interstitial layer (FIG. 5 (a)), and in which the catalyst interstitial layer escapes onto the surface of the catalyst layer by cooling to form graphene (FIG. 5 (b)).
Figure 5:

FIG. 5 schematically shows this mechanism.

As shown in FIG. 5, when the catalyst metal particles are bonded with the porous carrier in a form of an composite according to example embodiments, this catalyst more effectively has a $CO_2$ modify reaction through the larger interface between the carrier/catalyst, but further decreases coking and deterioration of the catalyst as a side reaction due to accumulation of carbon on the surface of the catalyst particles.

Accordingly, a composite catalyst of a catalyst/a carrier forms graphene at a higher rate than a non-composite catalyst of a catalyst/a carrier.

Specifically, the non-composite catalyst has several-layered graphene on the surface of catalyst particles, while the composite catalyst has single layered or 2- or 3-layered graphene on the surface of the catalyst particles.

As aforementioned, the catalyst particles may be bonded with the porous carrier to form a composite according to example embodiments, but are not limited thereto, and may be variously supported on the carrier to form graphene.

The metal catalyst may be supported in an amount of about 1 to about 50 wt %, specifically, about 3 to about 20 wt %, and more specifically, about 5 to about 12 wt % on the oxide carrier.

As aforementioned, the conventional chemical vapor deposition forms graphene on the surface of a catalyst layer due to a melting temperature difference between the catalyst and carbon by reacting a mixed gas of $CH_4$ and hydrogen at a relatively high temperature (about 1000° C.) so that carbon may be adsorbed in a transition metal (Ni or Cu) catalyst layer deposited on a substrate and then cooling down the resultant, but this requires a relatively difficult process of adjusting the concentration of the mixed gas so that an appropriate amount of carbon flows in the catalyst layer, a cooling rate for taking out the carbon from the surface of the catalyst layer and forming graphene thereon, and a thickness of the catalyst layer.

Figure 3:
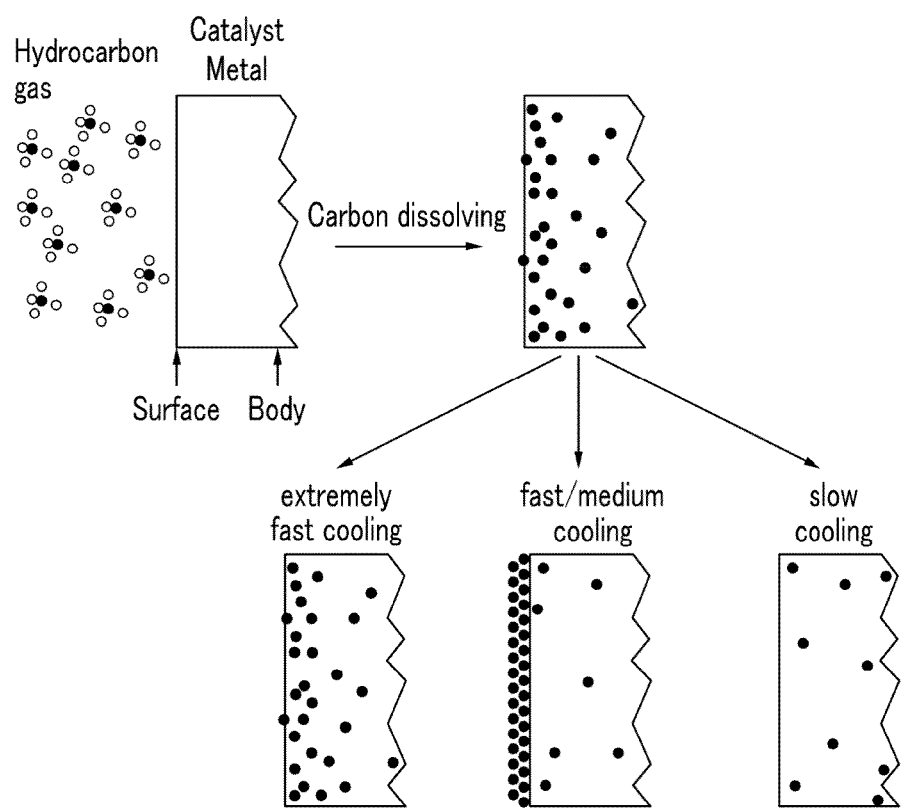
FIG. 3 is a schematic view showing different states in which carbon atoms absorbed in a catalyst layer move toward the surface of the catalyst layer depending on the cooling rate, when graphene is prepared in a conventional chemical vapor deposition method.

For example, as shown in FIG. 3, the cooling rate may bring about a substantial yield difference in that carbon comes out of the catalyst layer and forms graphene.

Specifically, when the cooling rate is too fast, the cooling may be complete before carbon atoms come out of the surface of the catalyst layer, while when the cooling is too slow, carbon atoms may not form graphene but fly away.

Accordingly, a medium cooling rate is appropriate for forming graphene, but is hard to control.

According to example embodiments, carbon dioxide ($CO_2$) and methane ($CH_4$) gases are used as a carbon source and water ($H_2O$) is used as a necessary reactant to prevent or reduce a coking phenomenon, as extra carbon atoms forming no graphene out of the molten carbon or escaping the catalyst layer react with oxygen (O) atoms in the water and produce CO and $H_2$ gases, otherwise the extra carbon atoms will be accumulated on the surface of the catalyst layer with a whisker shape.

Accordingly, the catalyst is used for a continuous process for forming graphene.

Figure 4:
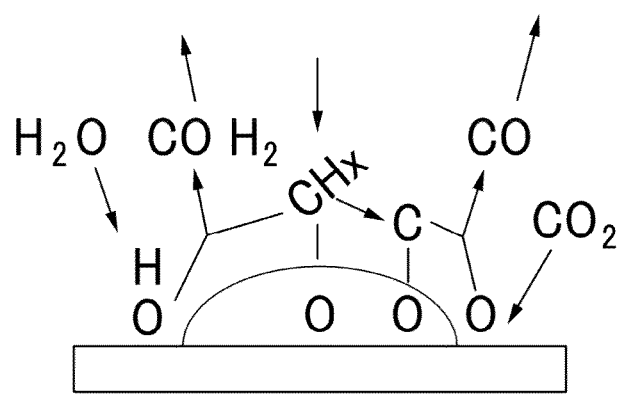
FIG. 4 is a schematic view showing a process in which carbon atom sources ($CO_2$ and $CH_4$) interact with water on the surface of a catalyst, and extra carbon atoms from the carbon atom sources and the water are converted into CO and $H_2$ gases and evaporated.

FIG. 4 schematically shows interaction of the carbon atom source ($CO_2$ and $CH_4$) with the water on the surface of the catalyst, and then conversion of extra carbon atoms therefrom and the water into CO and $H_2$ gases and evaporation thereof from the catalyst.

On the other hand, the extra carbon atoms are melted into the catalyst layer rather than coking on the surface of the catalyst layer and thus form a catalyst interstitial layer in the catalyst layer, and the catalyst interstitial layer comes out of the surface of the catalyst layer by cooling after the reaction and forms graphene.

The graphene formation is schematically shown in FIG. 5.

The reaction between the water and the carbon atom source may be appropriately performed in the above mole ratio of the $CH_4:CO_2:H_2O$ gases, but is not limited thereto, and the $CH_4$, $CO_2$, and $H_2O$ gases may be appropriately provided within the ratio range to prevent or reduce the extra carbon atoms from coking on the catalyst layer.

On the other hand, the coking prevention or reduction effect may be accomplished by directly injecting water ($H_2O$) along with $CH_4$ and $CO_2$ gases according to example embodiments, or by adding a material producing water during the reaction without directly injecting the water ($H_2O$).

In other words, when alcohol in an appropriate amount is added with the $CH_4$ and $CO_2$ gases, these additives may be heated to decompose the alcohol and produce water, bringing about the same effect.

Accordingly, the reaction may be performed by using a compound represented by $C_xH_yO_z$ capable of being converted into water during the heating in the same ratio as water in the reactant, instead of water.

As described above, the metal catalyst may be supported in a form of metal nanoparticles, specifically with a spherical, hemispherical, oval, or asymmetric hexagonal prismatic shape, on the carrier.

As described above, when the metal catalyst particles are bonded on the carrier to form a composite, the metal catalyst particles have a larger bonding area with the porous carrier and higher efficiency of producing graphene on the surface of the metal catalyst particles having the larger bonding area with the carrier.

Without being bound to a specific theory, graphene is formed by carbon melted into a catalyst layer through an interface between the catalyst and carrier.

Accordingly, as shown in FIG. 2 (a), since the metal catalyst particles are not just adsorbed on the carrier while maintaining a spherical shape themselves but are strongly bonded with the carrier in a form of a composite, the composite catalyst having a larger interface area between the catalyst and carrier may more efficiently form graphene on the surface of the catalyst.

In addition, since CO and $H_2$ gases are produced and evaporated by a reaction of extra carbon with water on the interface, a coking phenomenon in which carbon atoms are accumulated on the surface of the catalyst and coke the catalyst may be more effectively prevented or reduced in the catalyst as shown in FIG. 2(b).

In example embodiments, the catalyst may be provided in a form of a film or substrate, and a carrier supporting the catalyst may be provided on at least one part of the catalyst in the form of the film or substrate.

The carrier provided on the catalyst may be provided in a form of Al, Si, or Ti ions, and graphene may be produced where the carrier is provided on the catalyst substrate or film by providing $CO_2$, $CH_4$, and $H_2O$ gases.

The carrier ions may be provided on the catalyst substrate or film in a method of sputtering a gas including Al, Si, or Ti ions on the catalyst substrate or film or coating an aqueous solution including the carrier ions on the catalyst substrate or film.

Specifically, a compound including the carrier ions is dissolved in water to prepare an aqueous solution, and then the aqueous solution is spin-coated on a substrate. As described above, graphene is formed from carbon that is melted down into a catalyst layer through the interface between the catalyst and carrier and thus the graphene is formed only where the carrier, e.g., Al, Si, or Ti ions, is present on the catalyst substrate or film.

According to example embodiments, when the carrier ions are provided on a part of the catalyst substrate or film, graphene is produced only on the part of the substrate or film provided with the carrier ions.

If the carrier is provided with a pattern on the catalyst substrate or film, graphene is produced with the pattern on the substrate or film.

According to example embodiments, when the carrier is provided over the entire surface of the catalyst substrate or film, graphene is produced as a sheet on the entire surface of the substrate or film.

Accordingly, nanoparticles including the graphene, and a patterned graphene or a graphene sheet on a metal catalyst substrate or film prepared according to the method of preparing graphene, are provided.

Specifically, the nanoparticles including graphene may be metal nanoparticles encapsulated by graphene. For example, the metal nanoparticles encapsulated by graphene may be partially or entirely encapsulated by graphene.

The metal nanoparticles partially or entirely encapsulated by graphene may be prepared by preparing graphene on a surface of a metal nanoparticle supported on a porous carrier by using the method according to an embodiment. The obtained metal nanoparticle partially or entirely encapsulated by graphene on the porous carrier may be released from the porous carrier by removal of the porous carrier with a well-known method in the art, for instance, etching.

The metal nanoparticles may include at least one metal selected from Ni, Co, Cu, Fe, Rh, Ru, Pt, Au, Al, Cr, Mg, Mn, Mo, Si, Sn, Ta, Ti, W, U, V, Zr, brass, bronze, stainless steel, and Ge, or alloy nanoparticles including two or more of the foregoing metals, specifically Ni, Co, Cu, Fe, or two or more of the foregoing metals.

The metal nanoparticles may have a spherical shape, hemispherical shape, oval shape, or asymmetric hexagonal prism shape, and specifically, the metal nanoparticles may have an asymmetric hexagonal prismatic shape.

In addition, the metal nanoparticles may have a diameter ranging from about 10 to about 50 nm, and specifically, from about 20 to about 40 nm, and when the metal nanoparticles have an oval or asymmetric hexagonal prismatic shape, the diameter is measured with reference to the longest diameter in the cross-section of the nanoparticles.

The metal nanoparticles partially or entirely encapsulated by graphene may be used as various electronic materials, e.g., a light emitting material for a display, an electrode material of a battery or a solar cell, or a bio medicine material, e.g., drug delivery material in vivo.

Herein, the metal nanoparticles may particularly include magnetic metal nanoparticles, e.g., Fe, Co, Ni, or an alloy thereof.

On the other hand, when the metal nanoparticles encapsulated by graphene are heated to melt out the metal nanoparticles, a hollow graphene nanoparticle is obtained.

Only the metal nanoparticles may be etched by using an oxidation etchant, for example, an iron (III) chloride ($FeCl_3$) aqueous solution (1 M) in order to remove the metal nanoparticles and provide a hollow graphene nanoparticle.

However, the etchant solution is not limited thereto.

The graphene or graphene sheet is patterned on the metal catalyst substrate or film by providing at least a part of the substrate or film with Al, Si, or Ti ions and with $CO_2$, $CH_4$, and $H_2O$ gases, heating and reacting them, and cooling the resultant to form graphene only where the part of the substrate or film is provided with the Al, Si, or Ti ions.

Specifically, when the metal catalyst substrate or film is provided with the carrier ions, graphene is produced only on a part of the catalyst substrate or film where the carrier ions are provided.

Accordingly, when a carrier is provided with a pattern on a part of the metal catalyst substrate or film, graphene is formed with the pattern where the carrier is provided.

Figure 6:
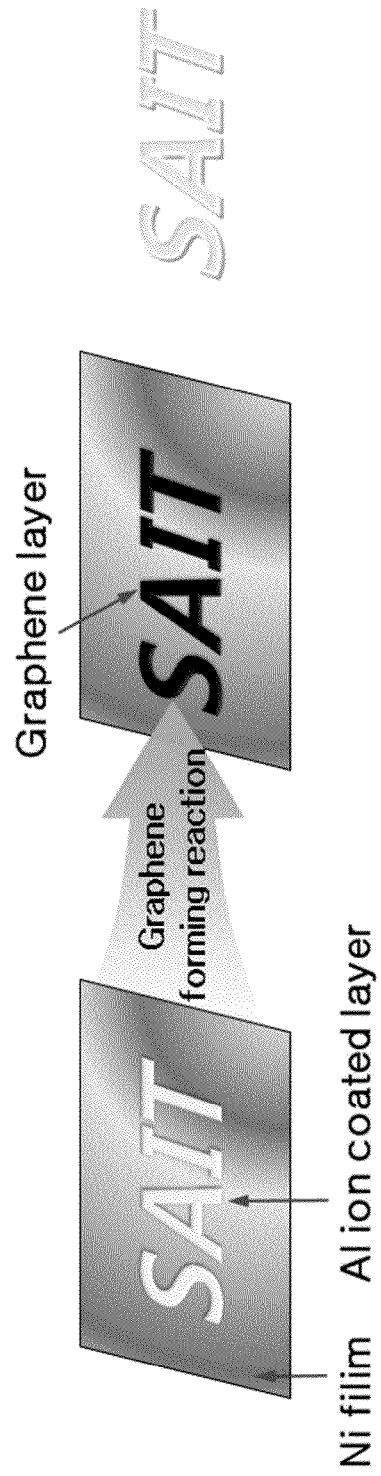
FIG. 6 is a schematic view showing a process in which graphene is formed according to the Al ion pattern on a Ni film according to example embodiments.

FIG. 6 shows the graphene pattern formation.

Referring to FIG. 6, when Al ions are coated along letters of "SAIT" on a Ni film as a metal catalyst, provided with $CO_2$, $CH_4$, and $H_2O$ gases, and then heated for a reaction and cooled down, a graphene film is formed in the letters "SAIT" provided with the Al ions.

Herein, the Ni film is etched using an etchant solution, leaving the letters "SAIT" formed of graphene.

The patterned graphene according to example embodiments may be used as a circuit or a semiconductor material.

In addition, a Ni film or substrate as a metal catalyst is provided overall with a carrier, e.g., Al ions, and with $CO_2$, $CH_4$, and $H_2O$ gases and heated for a reaction and cooled down to form a graphene film all over the Ni film or substrate, and the Ni film or substrate is removed to obtain the graphene sheet.

The method may more easily provide a graphene sheet having a large two-dimensional area.

The patterned graphene or graphene sheet may be easily regulated regarding thickness and shape by adjusting concentration of the carrier provided on the metal catalyst substrate or film.

Hereinafter, the present disclosure is illustrated in more detail with reference to examples and comparative examples.

However, these examples and comparative examples are examples, and the present disclosure is not limited thereto.

EXAMPLE

Preparation Example 1

Preparation of Catalyst for Graphene Growth (7 wt % Ni/$\gamma$-$Al_2O_3$)

A catalyst for graphene growth is prepared by supporting 7 wt % of a Ni metal catalyst on $\gamma$-$Al_2O_3$.

Specifically, alumina (150 $m^2$/g, the diameter of an alumina granule: about 3 mm $\phi$, Alfa) is impregnated in a $Ni(NO_3)_2 \cdot H_2O$ (Samchun Chemical) aqueous solution, dried in a 120° C. oven for 24 hours, and fired at 500° C. under an air atmosphere for 5 hours.

The fired catalyst is heated at a speed of 10° C./min and reduced under a nitrogen atmosphere, and then maintained at 850° C. under a hydrogen atmosphere, preparing a 7 wt % Ni/$\gamma$-$Al_2O_3$ catalyst.

The catalyst is cooled down to 30° C., and 5 ml of distilled water is added thereto.

Then, the mixture is heated (at 10° C./min) to evaporate the water therein under a hydrogen atmosphere and maintained at 850° C. for 1 hour.

A 3D TEM image of the catalyst is taken to examine the shape of the supported catalyst metal, and the cross-section of the supported catalyst metal is analyzed to evaluate the catalyst metal supported on the carrier.

FIG. 7 shows the cross-section of the 3D TEM image.

The catalyst metal has a bonding cross-section of a spherical or oval shape, which shows that catalyst particles have an interaction with the carrier and thus form a composite bonding therewith.

Preparation Example 2

Preparation of Catalyst for Graphene Growth (7 wt % Ni/γ-$Al_2O_3$)

A 7 wt % Ni/γ-$Al_2O_3$ catalyst is prepared in an initial wet method.

Alumina (150 $m^2$/g, the diameter of an alumina granule: about 3 mm φ, Alfa) is impregnated in a $Ni(NO_3)_2 \cdot H_2O$ (Samchun Chemical) aqueous solution, dried in an oven at 120° C. for 24 hours, and fired at 500° C. under an air atmosphere for 5 hours.

The fired catalyst is heated (at 10° C./min) and reduced under a nitrogen atmosphere and then maintained at 850° C. under a hydrogen atmosphere for one hour, preparing a 7 wt % Ni/γ-$Al_2O_3$ catalyst.

A 3D TEM image photograph of the catalyst is taken to examine the shape of the supported catalyst metal, and the cross-section of the supported catalyst metal is analyzed to evaluate the metal catalyst supported on the carrier.

FIG. 8 shows the cross-section of the 3D TEM image.

The 3D TEM image shows that the catalyst metal has a spherical shape.

Preparation Example 3

Preparation of Catalyst for Graphene Growth (Al Ion-Coated Catalyst on Ni Film)

0.1 g of an $Al(NO_3)_3 \cdot 9H_2O$ compound is dissolved in 3 ml of water, and the aqueous solution is spin-coated on a Ni film at a speed of 300 rpm and fired in an 80° C. oven for 600 minutes, preparing a catalyst coated with Al ions on the Ni film.

Preparation Example 4

Preparation of Catalyst for Graphene Growth (Ni-Deposited Catalyst on Silicon Wafer)

A catalyst for graphene growth is prepared by depositing Ni to be 300 nm thick on a semiconductor silicon wafer in a CVD method.

Example 1

Preparation of Graphene-Encapsulated Ni Nanoparticles

While $CH_4$, $CO_2$, and water ($H_2O$) in a ratio of about 1:0.38:0.81 are put in 0.45 g of the 7 wt % Ni metal catalysts supported on γ-$Al_2O_3$ according to Preparation Examples 1 and 2 at 700° C. at 1 atm under a nitrogen ($N_2$) condition at 200 sccm (standard cubic centimeters per minute), a reaction is performed for about 10 hours (gas hourly space velocity (GHSV)=50,666 k cc/g·hr).

FIG. 9 is a TEM photograph showing the catalyst according to Preparation Example 1 after the reaction, and FIG. 10 is a TEM photograph showing the catalyst according to Preparation Example 2 after the reaction.

As shown in the photograph of FIG. 9, the Ni metal catalyst has a hexagonal cross-section, and graphene is formed as a white monolayer or double layer along the external circumferential edge of the hexagonal cross-section.

The Ni particles have a diameter of about 35 to 40 nm.

FIG. 10 shows that a multiple layer graphene layer is formed on the Ni nanoparticles.

In addition, a Raman peak in FIG. 11 and an XPS peak in FIG. 12 show that graphene was formed on the catalysts.

Referring to FIG. 11, the catalyst according to Preparation Example 1 has a smaller D/G peak surface area and a higher crystalline graphene layer than the catalyst according to Preparation Example 2.

Referring to FIG. 12, the catalyst according to Preparation Example 1 has a clearer C—C or C═C peak showing the graphene characteristic than the catalyst according to Preparation Example 2, and the catalyst according to Preparation Example 2 has a metal carbide peak due to the whisker-shaped carbon.

Example 2

Preparation of Patterned Graphene

While $CH_4$, $CO_2$, and water ($H_2O$) in a ratio of about 1:0.38:0.81 are put in the Ni film coated with Al ions according to Preparation Example 3 at 700° C. at 1 atm under a nitrogen ($N_2$) condition for 2 hours at a speed of 200 sccm (standard cubic centimeters per minute), a reaction is performed for about 2 hours (gas hourly space velocity (GHSV)= 50,666 k cc/g·hr).

FIG. 13 is a SEM (scanning electron microscope) photograph showing a graphene layer on the Ni film after the reaction.

Based on the SEM photograph, graphene is found to be formed on an Al ion-coated part of the Ni film.

FIG. 14 shows a Raman peak exhibiting that graphene is formed on an Al ion-coated part of the Ni film.

Referring to FIG. 14, graphene has higher crystalline on the Al ion-coated part of the Ni film than the non-coated part of the Ni film.

FIG. 15 is an XPS graph showing that graphene is formed on the Al ion-coated part of the Ni film.

The XPS graph shows that graphene is formed as one layer, 2-3 layers, or a several layers depending on the concentration of Al.

Example 3

Preparation of Patterned Graphene

The specimen deposited to be 300 nm thick on a semiconductor wafer in a CVD method according to Preparation Example 4 is used as a catalyst for graphene growth to form graphene by injecting $CH_4$ and $H_2$ therein at respective speeds of 100 sccm and 200 sccm (standard cubic centimeters per minute), which is a conventional condition for producing graphene, and performing a reaction at 700° C. at 1 atm under a nitrogen ($N_2$) condition for 30 minutes, cooling down the graphene under an $N_2$ atmosphere, and after the graphene layer is reacted with the gases of $CH_4:CO_2:H_2O$ in a ratio of 100 sccm:100 sccm:10 sccm, the surface of the graphene layer is Raman-analyzed.

As a result of the analysis, as shown in FIG. 16, highly crystalline but less defective graphene is formed by adding $CO_2$ and $H_2O$.

In addition, FIG. 17 is a SEM (scanning electron microscope) photograph showing graphene produced on the Ni catalyst deposited on the semiconductor wafer, and FIG. 17 (b) is an enlargement of FIG. 17 (a).

While this disclosure has been described in connection with what is presently considered to be practical example embodiments, it is to be understood that the inventive concepts are not limited to the disclosed embodiments, but, on the contrary, is intended to cover various modifications and equivalent arrangements included within the spirit and scope of the appended claims.

What is claimed is:

1. A method of preparing graphene, the method comprising:
    supplying a gas on a metal catalyst, the gas including $CO_2$, $CH_4$, and $H_2O$; and
    reacting and cooling the resultant,
    wherein the supplying supplies the gas in a mole ratio of the $CH_4$, $CO_2$, and $H_2O$ gases at about 1:0.20-0.50:0.01-1.45.

2. The method of claim 1, wherein the supplying supplies the gas on at least one metal selected from Ni, Co, Cu, Fe, Rh, Ru, Pt, Au, Al, Cr, Mg, Mn, Mo, Si, Sn, Ta, Ti, W, U, V, Zr, brass, bronze, stainless steel, and Ge, or an alloy catalyst including two or more of the aforementioned metals.

3. The method of claim 1, wherein the supplying supplies the gas in a mole ratio of the $CH_4$, $CO_2$, and $H_2O$ gases at about 1:0.25-0.45:0.10-1.35.

4. The method of claim 1, wherein the supplying supplies the gas in a mole ratio of the $CH_4$, $CO_2$, and $H_2O$ gases at about 1:0.30-0.40:0.50-1.0.

5. The method of claim 1, wherein the reacting heats the resultant at about 400 to about 900° C.

6. The method of claim 1, wherein the cooling cools the resultant at a given rate in the presence of an inert gas.

7. The method of claim 1, wherein the supplying supplies the gas on the metal catalyst supported by a porous carrier of one of $Al_2O_3$, $SiO_2$, zeolite, $TiO_2$, and silicon.

8. The method of claim 7, wherein the supplying supplies the gas on the metal catalyst supported by the porous carrier while being bonded thereto to form a metal catalyst-porous carrier composite.

9. The method of claim 1, wherein the metal catalyst is in a form of one of a film and a substrate, and a carrier supporting the metal catalyst is on at least one part of the metal catalyst in the form of one of the film and the substrate.

10. The method of claim 9, wherein the metal catalyst is in the form of one of a Ni film and the substrate.

11. The method of claim 9, wherein the carrier on at least one part of the metal catalyst in the form of one of the film and the substrate is an ionic form of one of Al, Si and Ti.

12. The method of claim 1, wherein the graphene is made up of one sheet to five sheets.

13. The method of claim 9, wherein the carrier on at least one part of the metal catalyst in a form of one of a film and a substrate is provided in a patterned form.

14. A method of manufacturing a semiconductor circuit comprising the method of claim 1.

* * * * *